(12) United States Patent
Kitae et al.

(10) Patent No.: US 7,951,700 B2
(45) Date of Patent: *May 31, 2011

(54) FLIP CHIP MOUNTING METHOD AND BUMP FORMING METHOD

(75) Inventors: Takashi Kitae, Osaka (JP); Seiichi Nakatani, Osaka (JP); Seiji Karashima, Osaka (JP); Yoshihisa Yamashita, Kyoto (JP); Takashi Ichiryu, Osaka (JP)

(73) Assignee: Panasonic Corporation, Osaka (JP)

( * ) Notice: Subject to any disclaimer, the term of this patent is extended or adjusted under 35 U.S.C. 154(b) by 612 days.

This patent is subject to a terminal disclaimer.

(21) Appl. No.: 11/910,810

(22) PCT Filed: Mar. 16, 2006

(86) PCT No.: PCT/JP2006/305247
§ 371 (c)(1),
(2), (4) Date: Oct. 5, 2007

(87) PCT Pub. No.: WO2006/109407
PCT Pub. Date: Oct. 19, 2006

(65) Prior Publication Data
US 2009/0023245 A1 Jan. 22, 2009

(30) Foreign Application Priority Data
Apr. 6, 2005 (JP) .................. 2005-109645

(51) Int. Cl.
*H01L 21/00* (2006.01)
(52) U.S. Cl. ............ 438/613; 228/180.22; 257/E21.503
(58) Field of Classification Search .......... 438/106–108, 438/613; 252/512
See application file for complete search history.

(56) References Cited

U.S. PATENT DOCUMENTS
5,136,365 A * 8/1992 Pennisi et al. ................ 257/783
(Continued)

FOREIGN PATENT DOCUMENTS
JP 1-157796 6/1989
(Continued)

OTHER PUBLICATIONS
K. Yoko, "Pre-coating technology "Super Juffit Method" in the spotlight", Electronics Packaging Technologies, vol. 16, No. 9, pp. 38-45, 2000—with partial translation.

*Primary Examiner* — David A Zarneke
(74) *Attorney, Agent, or Firm* — Hamre, Schumann, Mueller & Larson, P.C.

(57) ABSTRACT

The invention involves mounting a solder resin composition (6) including a solder powder (5a) and a resin (4) on the first electronic component (2); arranging such that the connecting terminals (3) of the first electronic component (2) and the electrode terminals (7) of the second electronic component (8) are facing each other; ejecting a gas (9a) from a gas generation source (1) included in the first electronic component (2) by heating the first electronic component (2) and the solder resin composition; and inducing the flow of the solder powder (5a) in the solder resin composition (6) by inducing convection of the gas (9a) in the solder resin composition (6), and electrically connecting the connecting terminals (3) and the electrode terminals (7) by self-assembly on the connecting terminals (3) and the electrode terminals (7). Through this are provided a flip chip packaging method that enables connecting, with high connection reliability, electrode terminals of a semiconductor chip wired with narrow pitch and connecting terminals of a circuit board, and a bump formation method for packaging on a circuit board.

9 Claims, 7 Drawing Sheets

U.S. PATENT DOCUMENTS

| | | | |
|---|---|---|---|
| 5,145,532 A | 9/1992 | Fukunaga et al. | |
| 7,531,387 B1* | 5/2009 | Karashima et al. | 438/127 |
| 7,611,040 B2* | 11/2009 | Kitae et al. | 228/180.22 |
| 7,726,545 B2* | 6/2010 | Ichiryu et al. | 228/180.22 |
| 2002/0185309 A1 | 12/2002 | Imamura et al. | |
| 2006/0103028 A1* | 5/2006 | Hazeyama et al. | 257/778 |
| 2007/0001313 A1 | 1/2007 | Fujimoto et al. | |
| 2007/0243664 A1* | 10/2007 | Hirano et al. | 438/108 |

FOREIGN PATENT DOCUMENTS

| | | | |
|---|---|---|---|
| JP | 7-74459 | | 3/1995 |
| JP | 2000-94179 | | 4/2000 |
| JP | 2000-332055 | | 11/2000 |
| JP | 2002-329745 | | 11/2002 |
| JP | 2003158154 | * | 5/2003 |
| JP | 2004-260131 | | 9/2004 |
| JP | 2004260131 | * | 9/2004 |

* cited by examiner

FLIP CHIP MOUNTING METHOD AND BUMP FORMING METHOD

TECHNICAL FIELD

The present invention relates to a flip chip packaging method for mounting a semiconductor chip or the like on a circuit board, as well as to a method for forming bumps on a connecting terminal of a circuit board, and specifically to a bump formation method for reliably forming fine bumps on a circuit board having connecting terminals arranged at a narrow pitch, and packaging semiconductor chips.

BACKGROUND ART

In recent years, electronic devices whose prevalence is rapidly spreading and that are typified by mobile telephones, notebook computers, personal digital assistants (PDAs), and digital video cameras, are becoming smaller, thinner, and lighter in weight. Further, the demand for higher performance and multifunctionality is increasing. In order to meet this demand, the density of electronic circuits is increasing by leaps and bounds through the miniaturization of semiconductor devices and circuit components, as well as technologies to package these electronic components.

The focus of this technological development is high density packaging technologies of Large Scale Integrated Circuits (LSI). For example, accompanying the rapid advancement toward high pin count and narrow pitch of electrode terminals of LSI chips, there has been the popularization of CSP (Chip Size Packaging) by flip chip packaging of bare chips, PPGA (Plastic Pin Grid Array) to external terminals, as well as BGA (Ball Grid Array) packaging. For this reason, there is a demand for new packaging technologies that accommodate the speeding up, miniaturization, and increase in number of input-output terminals of ICs that are further mounted.

In the above-described flip chip packaging, a plurality of electrode terminals first are formed on the semiconductor chip, and solder or Au bumps are formed on these electrode terminals. Next, the bumps of the semiconductor chip are made to face connecting terminals formed on the circuit board, and the above-described bumps of the electrode terminals and the connecting terminals that correspond to each bump are connected electrically. Further, in order to improve the electrical and mechanical joining with the semiconductor chip and the circuit board, the step of underfilling resin material between the semiconductor chip and the circuit board is performed.

However, in order to package a next-generation LSI with an electrode terminal number exceeding 5,000 on a circuit board, it is necessary for there to be bump formation that corresponds to a narrow pitch of 100 μm or less, but it is difficult to achieve this with current solder bump technologies.

In addition, because it is necessary to form a plurality of bumps in proportion to the number of electrode terminals, there is demand for low cost and high productivity by reduction of packaging cycle per chip.

Conventionally, plating and screen printing methods have been used as bump formation technologies. However, although the plating method is suited to narrow pitch, there is a problem in productivity as the steps become complex. In addition, although the screen printing method has superior productivity, it is difficult to achieve narrow pitch because of mask use.

In these circumstances, in recent years there has been proposed a technology in which solder bumps are formed selectively on connecting terminals of LSI chips and circuit boards. This technology is not only suitable for fine bump formation, but because bumps can be formed all at once, productivity is superior, and this technology has started to gather attention as a packaging technology for circuit boards of next-generation LSI.

In the above-described packaging technology, a solder paste made of a mixture of solder powder and resin is applied to the entire surface of the circuit board on which has been formed a connecting terminal whose surface oxidation has advanced. Next, by heating the circuit board, the solder powder is melted, and bumps are formed selectively on connecting terminals without causing short-circuiting between adjacent connecting terminals (see, for example, Patent Document 1).

In addition, first, a paste form composition (chemical reaction deposition-type solder) whose main components are organic acid lead salt and metal tin is applied to the entire surface of the circuit board on which has been formed connecting terminals. Next, there is disclosed an example of initiating a substitution reaction of Pb and Sn by heating the circuit board, and selectively depositing an alloy of Pb and Sn on a connecting terminal of a circuit board (see, for example, Patent Document 2 or Non-Patent Document 1).

Further, there is disclosed an example of, after immersing the circuit board on which has been formed connecting terminals on the surface and forming an adhesive membrane on the surface of the connecting terminals only, attaching solder powder to the adhesive membrane and selectively forming bumps on the connecting terminals (see, for example, Patent Document 3).

The above-described Patent Document 1 has as its object to maintain wettability towards metals while making short-circuiting less likely to occur between connecting terminals by controlling the surface oxidation of solder powder. However, it is difficult to control characteristics that are essentially contradictory using only oxidation levels and oxidation method.

In addition, because the material of the chemical reaction deposition-type solder used in Patent Document 2 uses a specific chemical reaction, there is a low degree of freedom in selecting the solder composition, and there also remains the problem of making it free of Pb.

On the other hand, in Patent Document 3, solder powder is applied uniformly on the electrodes, so it is possible to obtain uniform solder bumps. In addition, because there is a large degree of freedom in terms of selecting the solder composition, the technology is superior as it is easy to make it free of Pb. However, because it is necessary to perform a particular chemical treatment using a chemical reaction in the step of selectively forming an adhesive membrane on the electrode surface necessary in the method of construction of Patent Document 3, the step not only is made complex but also leads to increase in costs, and thus there are problems in terms of mass production.

In order to solve these problems, there recently has been disclosed electronically joining only a particular conducting part by heating and applying pressure after sandwiching a film comprising anisotropic conductive material including conductive particles between protruding electrode terminals of a semiconductor chip and connecting terminals on a circuit board (see, for example, Patent Document 4).

In addition, there has been proposed technologies or the like as follows: A heat-curing resin including conductive particles is supplied between a semiconductor chip and a circuit board, and pressure is applied to the semiconductor chip while at the same time conductive particles melted by heating that resin are concentrated between the respective terminals of the semiconductor chip and the circuit board to establish electrical connection. At the same time, the semiconductor chip and the circuit board are connected (see, for example, Patent Document 5).

However, in the case of automatically concentrating melted solder powder between respective terminals of a semiconductor chip and circuit board by heating and applying pressure to resin placed in between the circuit board and the semiconductor chip, in general, the degree of viscosity of the electrically conductive adhesive applied on the circuit board increases gradually by polymerization proceeding during the heating step. For this reason, there was the problem that a sufficient amount of melted solder powder could not be moved to be on the electrode terminals, leading to the curing of the resin and the persistence of a portion of solder powder on a part other than in between connecting terminals, resulting in the lowering of insulating properties.

[Patent Document 1] Japanese Patent Laid-Open No. 2000-94179
[Patent Document 2] Japanese Patent Laid-Open No. 1-157796
[Patent Document 3] Japanese Patent Laid-Open No. 7-74459
[Patent Document 4] Japanese Patent Laid-Open No. 2000-332055
[Patent Document 5] Japanese Patent Laid-Open No. 2004-260131
[Non-Patent Document 1] Electronics Packaging Technologies, September 2000, pp. 38-45

DISCLOSURE OF INVENTION

The present invention further increases the effect of the above-described technologies proposed by the present inventors and others. That is, provided are a flip chip packaging method that has a high degree of connection reliability between electrode terminals of a semiconductor chip wired with narrow pitch and connecting terminals of a circuit board, as well as the ability to prevent short-circuiting between electrodes efficiently, and a bump formation method for packaging a semiconductor chip or the like on a circuit board having a plurality of connecting terminals.

The flip chip packaging method of the present invention is a flip chip packaging method for connecting a first electronic component including a plurality of connecting terminals and a second electronic component including a plurality of electrode terminals corresponding to the connecting terminals, comprising the steps of: mounting a solder resin composition including a solder powder and a resin on the first electronic component; arranging the connecting terminals of the first electronic component and the electrode terminals of the second electronic component to face each other; ejecting a gas from a gas generation source included in the first electronic component by heating the first electronic component and the solder resin composition; and inducing the flow of the solder powder in the solder resin composition by inducing convection of the gas in the solder resin composition, and electrically connecting the connecting terminals and the electrode terminals by self-assembly on the connecting terminals and the electrode terminals.

A bump formation method of the present invention comprises the steps of: mounting a solder resin composition including solder powder and resin on a circuit board including a plurality of connecting terminals, and making a cover material contact its top surface; ejecting a gas from a gas generation source included in the circuit board by heating the circuit board and the solder resin composition; inducing the flow of the solder powder in the solder resin composition by inducing convection of the gas in the solder resin composition, and causing self-assembly on the connecting terminals; and removing the cover material.

Another bump formation method of the present invention comprises the steps of: applying a mold release agent on a surface of a circuit board including a plurality of connecting terminals, excluding the plurality of connecting terminals; mounting a solder resin composition including solder powder and resin on a circuit board, and making a cover material contact its top surface; ejecting a gas from a gas generation source included in the circuit board by heating the circuit board and the solder resin composition; inducing the flow of the solder powder in the solder resin composition by inducing convection of the gas in the solder resin composition, and causing self-assembly on the connecting terminals; and forming a resin layer by curing the resin of the solder resin composition; and delaminating the cover material and the resin layer from the circuit board.

Still another bump formation method of the present invention comprises the steps of: mounting a solder resin composition including solder powder and resin on a circuit board including a plurality of connecting terminals, forming lands made of a metal at positions corresponding to the plurality of connecting terminals of the circuit board on top of the solder resin composition such that the lands are facing the connecting terminals, and making a cover material on which has been applied a mold release agent contact a region excluding the lands; ejecting a gas from a gas generation source included in the circuit board by heating the circuit board and the solder resin composition; inducing the flow of the solder powder in the solder resin composition by inducing convection of the gas in the solder resin composition, and causing self-assembly on the connecting terminals; forming a resin layer by curing the resin of the solder resin composition; and delaminating the cover material.

Yet another bump formation method of the present invention comprises the steps of: mounting a solder resin composition including solder powder and resin on a circuit board, and making a cover material contact its top surface; ejecting a gas from a gas generation source included in the circuit board by heating the circuit board and the solder resin composition; inducing the flow of the solder powder in the solder resin composition by inducing convection of the gas in the solder resin composition, and causing self-assembly on the connecting terminals; and removing the cover material and the resin after solidification of the melted solder powder.

BEST MODE FOR CARRYING OUT THE INVENTION

In the packaging body of the present invention, connecting terminals of a first electronic component and electrode terminals of a second electronic component are connected electrically by a solder connecting body. This solder connecting body is formed by assembling solder powder. This solder connecting body is formed by heating a solder resin composition including solder powder and resin, and ejecting a gas from a gas generation source, thus inducing flow (=inducing convection) of the resin and solder powder by the energy of motion of the gas, and joining in between the connecting terminals and electrode terminals by assembling the solder powder. That is, the resin in the solder resin composition is made to flow by heat and the ejected gas, and the solder powder is assembled on the electrode by the movement of the solder powder accompanying this flow.

In the present invention, the phrase "including solder powder and resin" means that when the entire solder resin composition is set to 100 weight %, the total amount of solder powder and resin is 20 weight % or greater. It is possible to include desired additives such as, for example, a cure agent, reaction initiating agent, light resisting agent, weather resistance agent, fixing agent, oxidized film removal agent, and coloring agent, to the solder resin composition resin of the present invention. In addition, it is possible to add solder powder, inorganic filler and organic filler other than resin to the solder resin composition of the present invention.

In the present invention, further, after the step of electrically connecting the connecting terminals and electrode terminals, the first electronic component and the second electronic component may be bonded by curing the resin.

Further, the gas generation source may be moisture included in the first electronic component.

Further, the gas generation source may be a gas generating agent included in the first electronic component.

Further, the gas generation source may be an evaporation-type gas generating agent selected from at least one of hexane, vinyl acetate, isopropyl alcohol, butyl acetate, propionic acid, ethylene glycol, N-methyl-2-pyrrolidone, α-terpineol, butyl carbitol, and butyl carbitol acetate.

Further, the gas generation source may be a decomposition-type gas generating agent selected from at least one of aluminum hydroxide, dawsonite, ammonium metaborate, barium metaborate, azodicarboxylic amide (ADCA), sodium acid carbonate, aluminum hydroxide, calcium aluminate, boric acid, N,N'-dinitrosopentamethylene tetramine (DPT), and 4,4'-oxybis (benzenesulfonyl hydrazide) (OBSH).

Further, the first electronic component may be a circuit board, and the second electronic component may be a semiconductor chip.

Further, a plurality of semiconductor chips may be packaged on the circuit board.

This realizes high density packaging of semiconductor devices.

Further, a solder resin composition may be in a paste form or in a sheet form.

Further, it is preferred that the gas generating agent has a boiling point or a decomposition temperature between the cure reaction start temperature and cure temperature of the solder resin composition, and that the gas is ejected from the circuit board at the boiling point or the decomposition temperature.

Further, the solder resin composition resin may be a heat-curing resin that has as its main component one of epoxy resin, unsaturated polyester resin, alkyd resin, polybutadiene resin, polyimide resin, polyamide resin, and cyanate resin.

Through these methods, it is possible to provide a flip chip packaging method that enables the connecting, with high connection reliability, electrode terminals of a semiconductor chip wired with narrow pitch and connecting terminals of a circuit board, and in which there is no short-circuiting between each terminal.

Also, as described above, by ejecting a gas from a gas generation source included in the circuit board by heating the circuit board and the solder resin composition, and inducing convection of the gas in the solder resin composition, the solder powder is made to flow in the solder resin composition, self-assembly is caused on the connecting terminals, and the cover material is removed.

In addition, as described above, gas is ejected from a gas generation source included in the circuit board by heating the circuit board and the solder resin composition; the solder powder is made to flow in the solder resin composition by inducing convection of the gas in the solder resin composition, causing self-assembly on the connecting terminals; and the cover material is removed.

The cover material may be a cover material on which has been applied a cover material comprising one of silicone resin, fluorine resin, and polypropylene resin, and a mold release agent such as silicon oil.

Further, the thickness of the mold release agent may be thicker than the thickness of the lands.

Further, the resin included in the solder resin composition may not cure by heating and may have flowability when cooled.

Further, the gas generation source may be moisture included in the circuit board.

Further, the gas generation source may be a gas generating agent included in the circuit board.

Further, the gas generation source may be an evaporation-type gas generating agent selected from at least one of hexane, vinyl acetate, isopropyl alcohol, butyl acetate, propionic acid, ethylene glycol, N-methyl-2-pyrrolidone, α-terpineol, butyl carbitol, and butyl carbitol acetate.

Further, the gas generation source may be a decomposition-type gas generating agent selected from at least one of aluminum hydroxide, dawsonite, ammonium metaborate, barium metaborate, azodicarboxylic amide (ADCA), sodium acid carbonate, aluminum hydroxide, calcium aluminate, boric acid, N,N'-dinitrosopentamethylene tetramine (DPT), and 4,4'-oxybis(benzenesulfonyl hydrazide) (OBSH).

Further, the solder resin composition may be either in a paste form or in a sheet form.

Further, the solder resin composition may be a heat-curing resin that has as its main component one of epoxy resin, unsaturated polyester resin, alkyd resin, polybutadiene resin, polyimide resin, polyamide resin, and cyanate resin.

These methods enable many bumps to be formed on connecting terminals of a circuit board in a uniform and productive fashion.

In addition, the flip chip packaging body of the present invention may be manufactured by the above-described flip chip packaging method.

Also, the bump packaging body of the present invention may be manufactured by the above-described bump formation method.

These enable the realization of a flip chip packaging body of a semiconductor chip and circuit board corresponding to narrow pitch and high pin count, and a bump packaging body such as a circuit board.

In the previous description, it is preferred that the melting point of solder powder be within the range of 16° C. and 316° C.

In addition, it is preferred that the average particle size of the solder powder be within the range of 1-50 μm.

Also, it is preferred that the temperature of heating the solder resin composition is above the solder melting point.

The desired solder powder may be selected and used. For example, the materials indicated in the following TABLE 1 may be selected and used. The materials shown in TABLE 1 that were listed as one set of examples may be used independently or in any combination.

TABLE 1

| Composition of solder power | Melting point (solid phase line)(° C.) |
|---|---|
| 24In—76Ga | 16 |
| Sn—57Bi—26In | 79 |
| Sn—58In | 117 |
| SN—58Bi | 139 |
| Sn—37Pb | 183 |
| Sn—9Zn | 199 |
| Sn—3.0Ag—0.5Cu | 217 |
| Sn—3.5Ag | 221 |
| Sn—0.7Cu | 228 |
| 12Sn—2.0Ag—10Sb—Pb | 240 |
| Sn—90Pb | 268 |
| Sn—1.5Ag—93.5Pb | 296 |
| Sn—95Pb | 316 |

The preferred average particle size of the solder powder is within the range of 1-50 μm. Moreover, the average particle size may be measured using a commercially available particle size distribution scale. For example, Horiba Ltd.'s laser diffraction particle size distribution analyzer (LA920), Shimadzu Corporation's laser diffraction particle size distribution analyzer (SALD2100) or the like may be used for measurement.

The following is a description of the resin. As representative examples of resin, epoxy resin, phenol resin, silicone resin, diallyl phthalate resin, furan resin, melamine resin or the like as heat-curing resin; as well as polyester elastomer, fluorine resin, polyimide resin, polyamide resin, aramid resin or the like as thermoplastic resin; or light (UV) curing resin or the like; or materials comprising combinations thereof can be used.

It is preferred that the solder powder is within the range of 4-75 weight %. It is preferred that the solder powder and resin are used after uniform mixing. For example, 50 weight % solder powder and 50 weight % epoxy resin are made to be uniformly mixed in a mixer, and then used. Moreover, it is possible to form and use it in a paste form or in a sheet form while maintaining a dispersed state of the solder powder.

Further, as a preferred example of the present invention, for example, solder alloy particles with a melting point of 200° C.-250° C., Pb-free, may be used as a solder powder.

According to the present invention, electrical connection can be carried out by flip chip packaging by efficient self-assembly of solder powder on connecting terminals or the like by utilizing convection and flow of a solder resin composition by a gas ejected from a gas generation source included in a circuit board or the like. Further, because insulation properties can be improved by inhibiting, as much as possible, residual solder powder in a region other than the connecting terminals, the present invention has a large effect on flip chip packaging with semiconductor chips that are advancing in terms of narrow pitch and high pin count, and on bump formation of circuit boards or the like.

Below, preferred embodiments of the present invention will be described with reference to the drawings. Moreover, the present invention is not limited to the embodiments below. In each figure, identical components will be assigned identical reference numerals and described.

First Embodiment

Figure 1A:
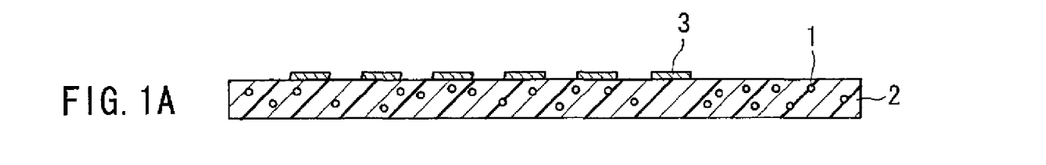
FIGS. 1A-E are step cross-sectional views showing a flip chip packaging method according to a first embodiment of the present invention.

FIGS. 1A-E are step cross-sectional views showing the flip chip packaging method according to the first embodiment of the present invention. First, as shown in FIG. 1A, a circuit board 2, which is a first electronic component on which a plurality of connecting terminals 3 are formed and that comprises, for example, aramid epoxy resin, is prepared. And, in the circuit board 2 is included moisture included by attachment or absorption to the circuit board 2, and a gas generation source 1 comprising, for example, an evaporation-type gas generating agent such as an alcohol and a decomposition-type gas generating agent such as aluminum hydroxide and ammonium metaborate.

Figure 1B:
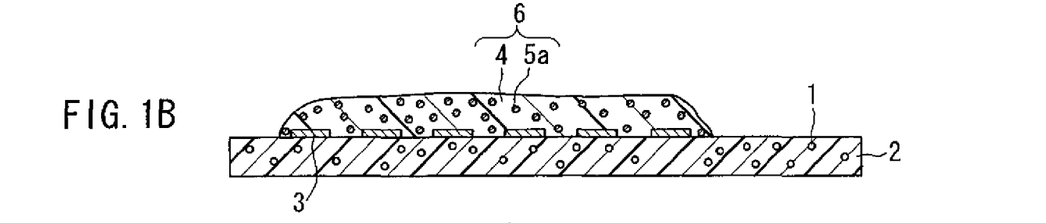

Next, as shown in FIG. 1B, the surface of the circuit board 2 on which has been set up the plurality of connecting terminals 3 is supplied with a solder resin composition 6 in which a solder powder 5a has been uniformly dispersed in a resin 4 including a heat-curing resin comprising, for example, bisphenol A-type epoxy resin and dicyandiamide as the main components, using, for example, a dispenser (not shown in the drawings) or the like. Moreover, the solder resin composition may include an oxide film removal agent (e.g., flux, etc.) for the purpose of removing the surface oxide film of the solder powder.

Figure 1C:
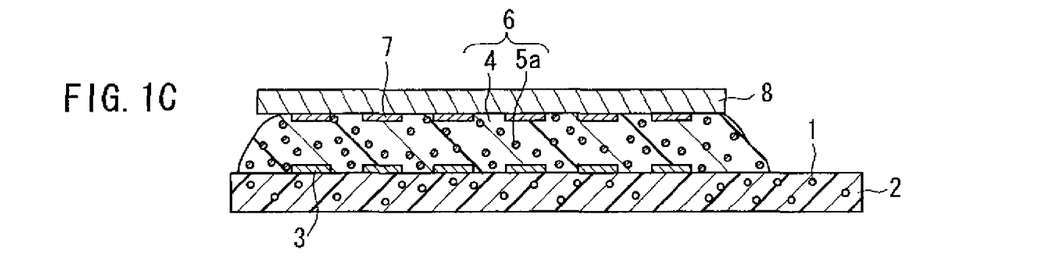

Next, as shown in FIG. 1C, a semiconductor chip 8 having a plurality of electrode terminals 7 is made to contact, as a second electronic component, the upper surface of a solder resin composition 6. At this time, the electrode terminals 7 of the semiconductor chip 8 and the connecting terminals 3 of the circuit board 2 are arranged to face each other.

Figure 1D:
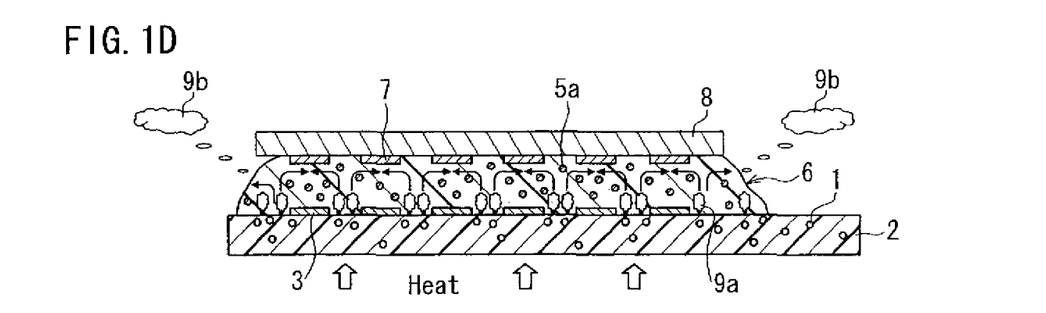

Next, as shown in FIG. 1D, the circuit board 2 and the solder resin composition 6 are heated from at least the circuit board 2 side (direction shown with an arrow) using, for example, a heater (not shown in the drawings). By doing so, the gas generation source 1 of moisture or the like included in the circuit board 2 boils, and a gas 9a such as water vapor is ejected from the surface of the circuit board 2 to the body of the solder resin composition 6. At this time, a large part of the gas 9a is ejected from the surface other than the connecting terminal 3 of the circuit board 2. By doing so, the solder powder present between the connecting terminals 3 and the connecting terminals 3 is effectively moved to be on the connecting terminals 3, and short-circuiting and generation of solder balls are prevented.

Then, accompanying this rise in temperature is a decrease in the viscosity of the solder resin composition 6, and the ejected gas 9a induces the convection of the solder resin composition 6.

In addition, in the present invention, the expression "convection" is used as an expression whose meaning broadly encompasses the movement and flow of the solder resin composition. Because the solder powder 5a is forcibly moved by this convection, a solder layer is formed uniformly on each of the connecting terminals 3 and the electrode terminals 7. At this time, after making the solder resin composition 6 flow, the gas 9a is discharged as a discharge gas 9b to the outside from the peripheral spaces surrounded by the circuit board 2 and the semiconductor chip 8.

Figure 1E:
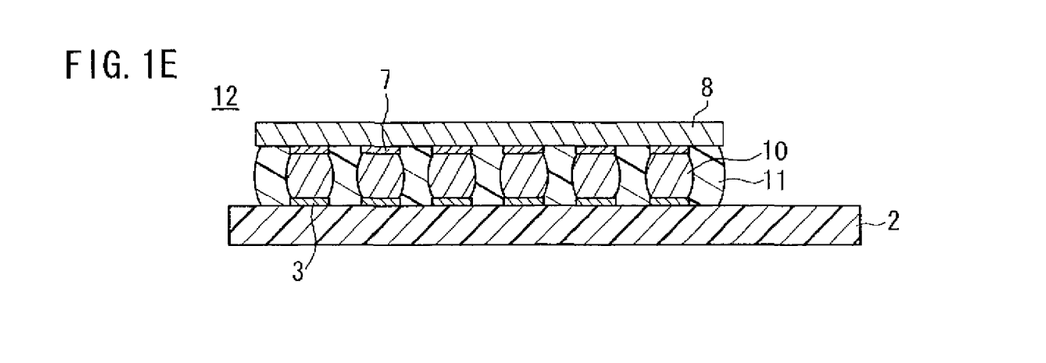

Next, as shown in FIG. 1E, the melted solder powder continues to grow while self-assembling on the connecting terminals 3 and the electrode terminals 7, and a solder layer 10 finally is formed between the connecting terminals 3 of the circuit board 2 and the electrode terminals 7 of the semiconductor chip 8, thus resulting in the manufacture of a flip chip packaging body 12. Then, by curing the resin of the solder resin composition 6, a resin layer 11, which fixes the circuit board 3, and the semiconductor chip 8 is formed simultaneously.

Below, the operation of the gas ejected from the gas generation source of the present invention shown in the step of FIG. 1D will be described in further detail using FIG. 2.

FIGS. 2A-D are cross-sectional views that shows, in an enlarged and schematic manner, a portion of the process in which the solder powder 5a shown in FIG. 1D is self-assembled, grown and joined on the connecting terminals 3 of the circuit board 2 and the electrode terminals 7 of the semiconductor chip 8 by the convection generated by the gas 9a ejected from the gas generation source 1 of the circuit board 2. Note that FIGS. 2A-D show the case of the melted solder powder 5a self-assembling while undergoing convection. Other than this, there is the case in which only convection occurs due to the gas 9a having been ejected at a temperature at with melting does not occur (below the melting temperature), and the solder powder 5a self-assembles on the connecting terminals 3 and the electrode terminals 7 by the effect of ejecting the gas 9a from between the connecting terminals 3 and the connecting terminals 3.

Figure 2A:
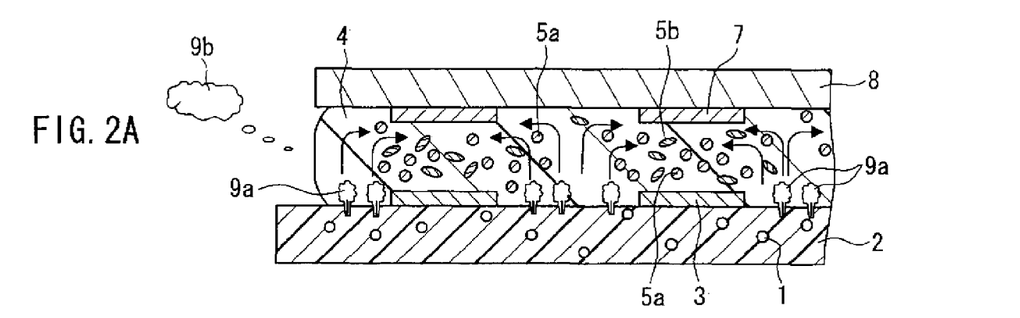
FIGS. 2A-D are cross-sectional views in which a portion of the steps of the flip chip packaging method according to the first embodiment of the present invention is enlarged and schematically shown.

First, as shown in FIG. 2A, the solder powder 5a is made to flow through the solder resin composition 6 by the convection, which is shown by the arrow, generated by the gas 9a after boiling of the gas generation source 1 included in the circuit board 2 due to the increase in temperature of the circuit board 2.

Figure 2B:
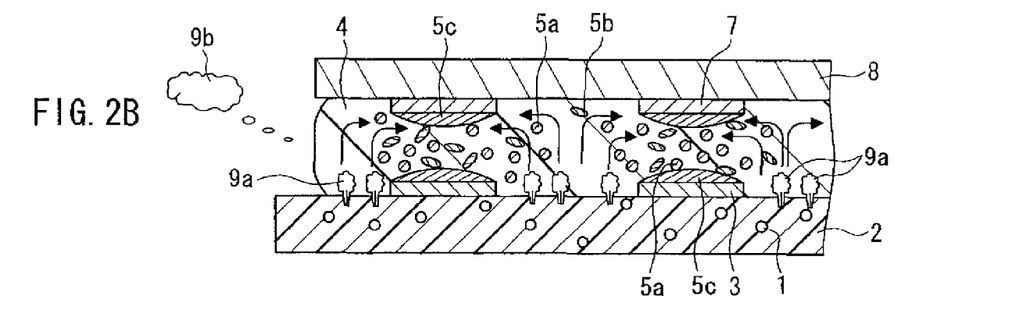

Next, as shown in FIG. 2B, a part of the heated solder powder 5a becomes a melted solder 5b and flows in the solder resin composition 6 together with the solder powder 5a. Then, upon reaching the vicinity of the connecting terminals 3 of the circuit board 2 and the electrode terminals 7 of the semiconductor chip 8, it is captured and wet joined by the connecting terminals 3 and the electrode terminals 7, which have a high degree of wettability against a solder, and a fusion solder 5c is formed on each of the terminals. At this time, the gas 9a ejected from the gas generation source 1 of the circuit board 2 is made to undergo convection in the solder resin composition 6 and is discharged as the discharge gas 9b to the outside from the peripheral spaces surrounded by the circuit board 2 and the semiconductor chip 8.

Figure 2C:
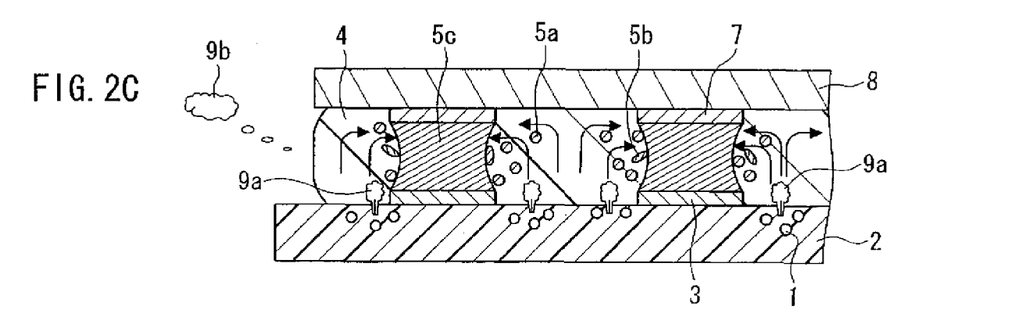

Next, as shown in FIG. 2C, the fused solder 5c captured in the connecting terminals 3 and the electrode terminals 7, further by the gas 9a ejected from the gas generation source 1 of the circuit board 2, self-assemble the solder powder 5a and the melted powder 5b that are undergoing convection in the surroundings, and grow. Ultimately, the fusion solder 5c on the connecting terminals 3 and the fusion solder 5c on the electrode terminals 7 contact each other and unite. In addition, at this point, the self-assembly of the solder powder 5a and the melted solder 5b reach the final stages, and the generation of the gas 9a supplied from the gas generation source 1 by heating is decreased.

Figure 2D:
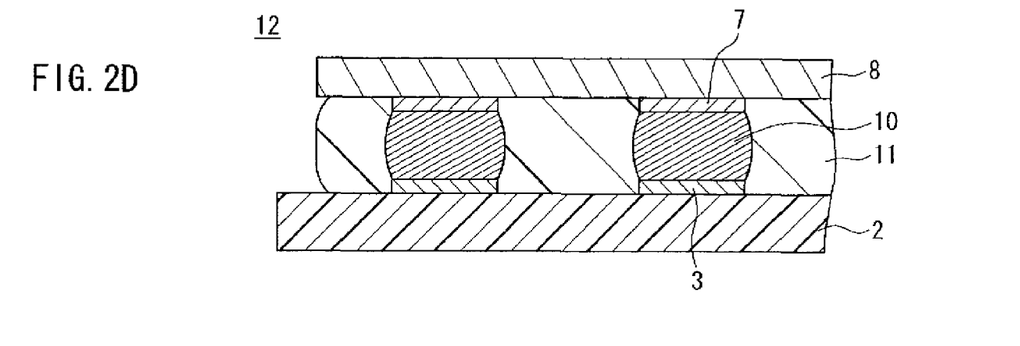

Further, as shown in FIG. 2D, the connecting terminals 3 of the circuit board 2 and the electrode terminals 7 of the semiconductor chip 8 are connected electrically by the solder layer 10, and the flip chip packaging body 12 in which the semiconductor chip 8 and the circuit board 2 are fixed by the resin layer 11 is manufactured.

Note that FIG. 1E and FIG. 2D show the flip chip packaging body 12 in which the semiconductor chip 8 is flip chip packaged on the circuit board 2. As shown in the same diagram, after the electrode terminals 7 of the semiconductor chip 8 are connected to the connecting terminals 3 on the circuit board 2 by the solder layer 10, the resin 4 in the solder resin composition 6 is hardened and becomes the resin layer 11, and mechanically bonds the circuit board 2 and the semiconductor chip 8. This enables the omission of the filling step of the underfill resin that was conventionally necessary.

In addition, in the first embodiment of the present invention, an example of using a heat-curing resin with bisphenol A-type epoxy resin as the main component as the resin of the solder resin component 6 was described, but the component is not limited to this. For example, desirable effects can be obtained by using polyimide resin, cyanate resin, or the like. In addition, in the first embodiment of the present invention, an example of applying the solder resin composition 6 including the solder powder 5a on the circuit board 2 in paste form was described, but other examples are possible. For example, it is possible to half-harden the solder resin composition 6 in advance and use it as a sheet form resin of prepreg state.

Also, in the first embodiment of the present invention, aramid epoxy resin substrate was used as the circuit board 2, but this does not place particular limitations on the circuit board 2 including the gas generation source 1. For example, glass epoxy resin substrate or polyimide resin substrate or the like may be used.

Here, the amount of gas generation source 1 included in the circuit board 2 will be described by giving an example using water levels. Generally, the moisture content of the circuit board such as an aramid epoxy resin is under 3.5 weight %, so the water amount is estimated with the moisture content in the circuit board set to 1.5 weight %. In this case, if it is assumed that the size of the circuit board used in the first embodiment of the present invention has an area with dimensions of vertical 10 mm, horizontal 10 mm, thickness 0.4 mm, and specific gravity of the circuit board of 2.0, 1.2 mg of the water exists in the circuit board as a gas generation source. In addition, when the circuit board is heated to 150° C.-250° C., if about 50% is generated as a gas from the gas generation source of the circuit board, a water amount of about 1.16 ml is ejected as a gas such as water vapor. Given that the space between the circuit board and the semiconductor chip is several tens of μm to several hundreds of μm, this gas amount can be considered to be a necessary and sufficient amount for making solder powder and melted powder, both of which are floating in the solder resin composition, move to and self-assemble on the connecting terminals.

Also, in the case where the gas generation source level (e.g., moisture content) of the gas generation source included in the circuit board is not sufficient, by maintaining for a certain period of time in a constant-temperature, constant-humidity tank set at, for example, a temperature of 30° C.-85° C. and a relative humidity of 60%-85% RH, it is possible to absorb a sufficient amount of moisture as a gas generation source. Further, a method of immersing the circuit board in water can be used.

In addition, in the case of using organic solvents such as butyl acetate and ethylene glycol as the gas generation source, by immersing or leaving the circuit board in these organic solvents under given conditions, it is possible to include the organic solvent in the circuit board as a gas generation source supplying the required gas level.

To describe a specific example, as a gas generation source, a substrate into which was impregnated approximately 0.7 weight % butyl acetate was used as a glass fiber-reinforced epoxy resin substrate. The solder resin composition that was used was a uniform mixture with 65 weight parts bisphenol F-type epoxy resin (Japan Epoxy Resins Co., Ltd., Epikoat 806) and 35 weight parts SnAgCu powder of an average particle size of 20 μm. This solder resin composition was injected between the circuit board and the semiconductor chip surface using a dispenser and the temperature was raised from room temperature (25° C.) to 250° C. and maintained for 30 seconds. Subsequently, when a cross-section was observed, the state of FIG. 2D could be confirmed.

Second Embodiment

Below, FIGS. 3A-F will be used to describe the bump formation method according to the second embodiment of the present invention. FIGS. 3A-F are step cross-sectional views describing the bump formation method according to the second embodiment of the present invention.

Figure 3A:
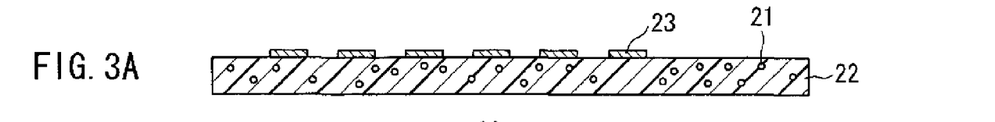
FIGS. 3A-F are step cross-sectional views showing a bump formation method according to a second embodiment of the present invention.

First, as shown in FIG. 3A, a circuit board 22, which is a first electronic component on which a plurality of connecting terminals 23 are formed and that comprises, for example, aramid epoxy resin, is prepared. And, in the circuit board 22 there is moisture included by attachment or absorption to the circuit board 22, and a gas generation source 21 comprising, for example, an evaporation-type gas generating agent such as an alcohol and a decomposition-type gas generating agent such as aluminum hydroxide and ammonium metaborate.

Figure 3B:
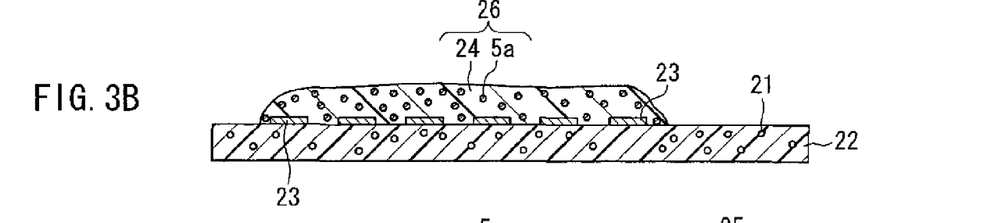

Next, as shown in FIG. 3B, the surface of the circuit board 22 having the plurality of connecting terminals 23 is provided with a solder resin composition 26 in which the solder powder 5a has been dispersed uniformly in a resin 24 including a heat-curing resin comprising, for example, bisphenol F-type epoxy resin as the main component, using, for example, a dispenser or the like.

Figure 3C:
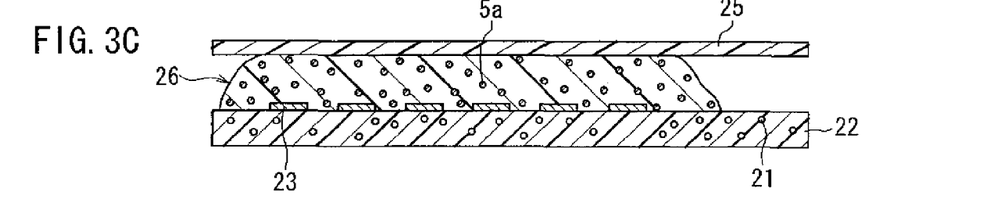

Next, as shown in FIG. 3C, a cover material 25 comprising mold release resin such as, for example, polypropylene resin is mounted on the upper surface of the solder resin composition 26. In this case, it is preferable to keep the cover material 25 apart from the circuit board 22 at a predetermined interval, because uniform bumps can be formed. The cover material 25 can be kept apart from the circuit board 22 at a predetermined interval by, for example, using a jig, a spacer or the like.

Figure 3D:
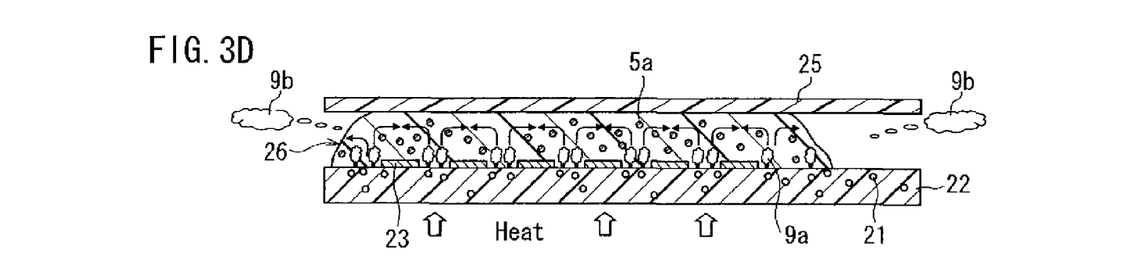

Next, as shown in FIG. 3D, the circuit board 22 and the solder resin composition 26 are heated from at least the circuit board 22 side using, for example, a heater. By doing so, the gas generation source 21 such as moisture or the like included in the circuit board 22 boils, and, for example, the gas 9a such as water vapor is ejected from the surface of the circuit board 22 to in the solder resin composition 26. At this time, a large part of the gas 9a is ejected from the surface other than the connecting terminal 23 of the circuit board 22.

Then, accompanying this rise in temperature is a decrease in the viscosity of the solder resin composition 26, and the ejected gas 9a induces the convection of the solder resin composition 26. This convection causes the solder powder 5a to self-assemble on the connecting terminals 23. At this time, the gas 9a, after making the solder resin composition 26 flow, is discharged as discharge gas 9b to the outside from the peripheral spaces surrounded by the circuit board 22 and the cover material 25.

Figure 3E:
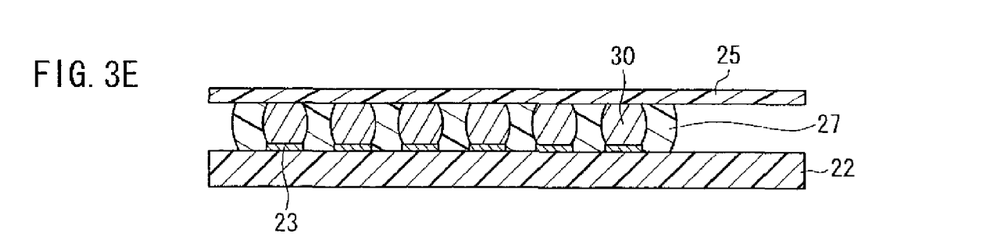

Next, as shown in FIG. 3E, the melted solder powder is self-assembled on the connecting terminals 23, and grown while forming a fusion solder as in the case shown in FIG. 2B. Subsequently, the upper end of the fusion solder reaches the cover material 25, and bumps 30 finally are formed between the connecting terminals 23 of the circuit board 22 and the cover material 25. In addition, by curing the resin 24 of the solder resin composition 26, a resin layer 27 is formed simultaneously.

Figure 3F:
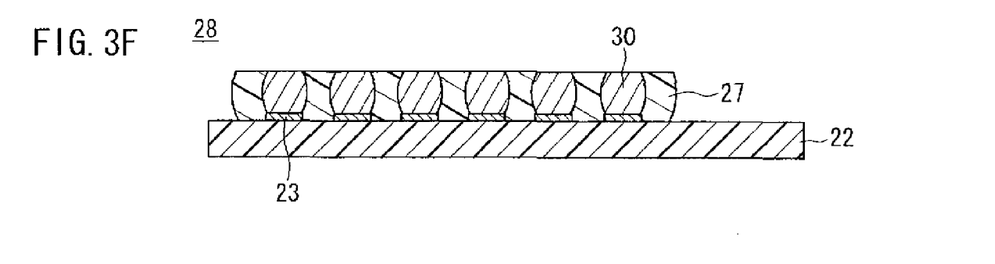

Then, as shown in FIG. 3F, by delaminating the cover material 25 comprising mold release resin, a bump packaging body 28 that has bumps 30 formed on the connecting terminals 23 of the circuit board 22 and a resin layer 27 including the hardened resin 24 of the solder resin composition 26 is formed.

Moreover, in the final stages of the steps shown in FIG. 3D, because most of the moisture, which is the gas generation source 21 in the circuit board 22, is evaporated and is discharged from the circuit board 22 to the outside as discharge gas 9b, the insulation property of the circuit board 22 is not decreased.

Also, because the cover material 25 is formed by a mold release resin such as polypropylene resin that does not have adhesiveness towards solder and resins such as heat-curing resins, the cover material 25 can be delaminated easily from the circuit substrate 22.

Also, although not shown in the drawings, in the case of flip chip packaging for example a semiconductor chip or the like on the bumps 30 on the circuit board 22, the resin layer 27 can be removed from the circuit board 22 and used.

Moreover, in the second embodiment of the present invention, an example in which polypropylene resin was used as the cover material 25 was described, but is not limited only to this. For example, it is possible to obtain a similar effect using silicone resin, fluorine resin, or the like.

Also, it is possible to apply a mold release agent such as, for example, silicon oil to the surface of a cover material that is not a mold release resin and using this as the cover material 25.

Third Embodiment

Below, FIGS. 4A-F be used to describe the bump formation method according to the third embodiment of the present invention. FIGS. 4A-F are step cross-sectional diagrams describing the bump formation method according to the third embodiment of the present invention.

Figures 4A, 4B:
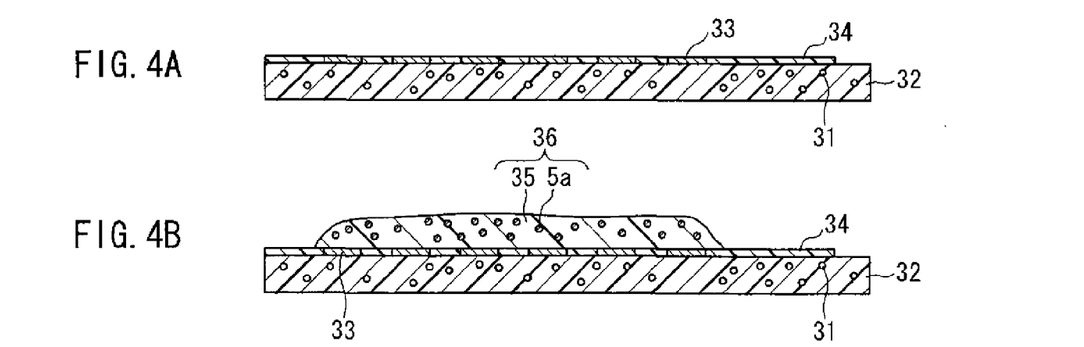
FIGS. 4A-F are step cross-sectional views showing a bump formation method according to a third embodiment of the present invention.

First, as shown in FIG. 4A, a gas generation source 31 is formed by applying by, for example, a printing method, a mold release agent 34 such as silicon oil, on the upper surface of a circuit board 32 excluding connecting terminals 33 set up on the upper surface of the circuit board 32 including, for example, aluminum hydroxide.

Next, as shown in FIG. 4B, a solder resin composition 36 in which the solder powder 5a has been uniformly dispersed in a resin 35 comprising flux or organic solvent, is applied using, for example, a dispenser.

Figure 4C:
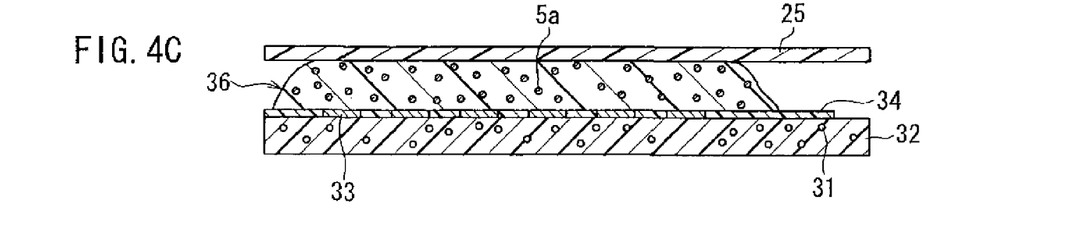

Next, as shown in FIG. 4C, the cover material 25 comprising, for example, a mold release resin such as a polypropylene resin sheet or silicone resin sheet is mounted, as in the case of the second embodiment, on the upper surface of the solder resin composition 36.

Figure 4D:
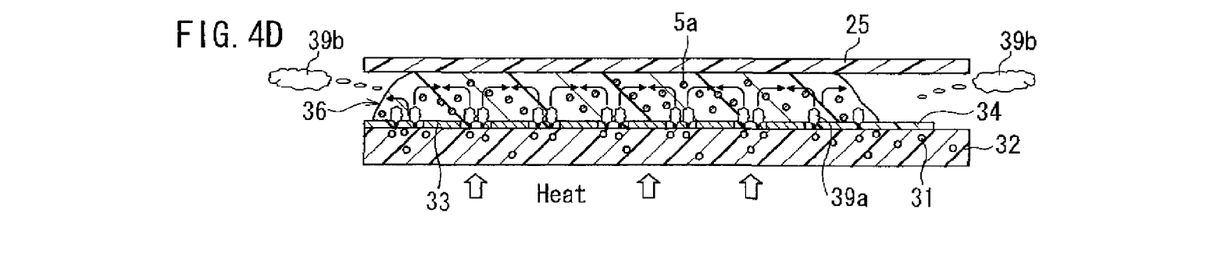

Next, as shown in FIG. 4D, the circuit board 32 is heated from the bottom surface by, for example, a heater or the like to a temperature of equal to or greater than 230° C., which is the temperature at which at least the solder powder 5a is melted and is also the decomposition temperature of aluminum hydroxide of the gas generation source 31. By doing so, aluminum hydroxide is decomposed, and water vapor is ejected as a gas 39a to the solder resin composition 36 after being transmitted through the mold release agent 34 from the surface of the circuit board 32.

In addition, the ejected gas 39a causes convection of the solder resin composition 36. The solder powder 5a is self-assembled on the connecting terminals 33 by this convection. At this time, after making the solder resin composition 36 flow, the gas 39a is discharged to the outside from the peripheral space surrounded by the circuit board 32 and the cover material 25 as a discharge gas 39b.

Figure 4E:
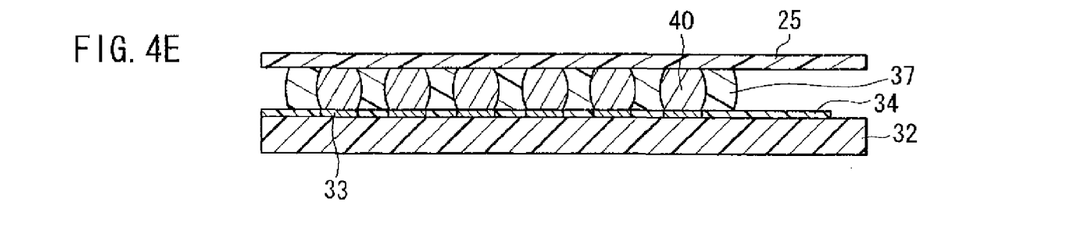

Next, as shown in FIG. 4E, the melted solder powder is self-assembled on the connecting terminals 33, and grows while forming fusion solder as in the case shown in FIG. 2B. Subsequently, the top end of the fusion solder reaches the cover material 25, and ultimately bumps 40 are formed between the connecting terminals 33 of the circuit board 32 and the cover material 25. In addition, by curling the resin 35 of the solder resin composition 36, a resin layer 37 is formed simultaneously.

Figure 4F:
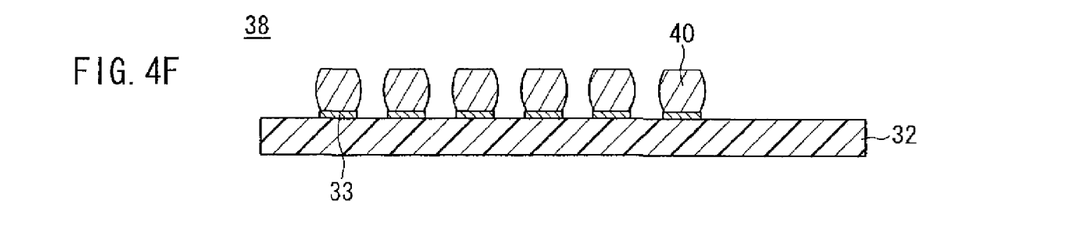

Then, as shown in FIG. 4F, the cover material 25 comprising mold release resin is delaminated, and, subsequently, by delamination of the mold release agent 34 further formed on the circuit board 32, the resin layer 37 is delaminated simultaneously. This enables a bump packaging body 38 with only the bumps 40 left on the circuit board 32 to be obtained.

Moreover, because the cover material 25 is formed from a mold release resin such as a polypropylene resin sheet that does not have adhesive properties towards solder and resins such as heat-curing resins, it is possible easily to delaminate from the bumps 40 and the resin layer 37. In addition, the resin layer 37 is hardened via the mold release agent 34 on the circuit board 32, so it is easy to delaminate the resin layer 37 from atop the circuit board 32.

Note that in the third embodiment of the present invention, a description was given of an example using silicon oil as the mold release agent 34, but it is not strictly limited to this. For example, it is possible to use a mold release agent of a film form or sheet form. In addition, in the case of applying a mold release agent, because ejection of the gas 39a generated from the gas generation source 31 of the circuit board 32 cannot be prevented, it is preferred to set up a part on which the mold release agent is not applied if the mold release agent is in liquid form, and to fabricate holes if the mold release agent is in sheet form.

Fourth Embodiment

Below, FIGS. 5-7 will be used to describe the bump formation method according to the fourth embodiment of the present invention.

Figure 5A:
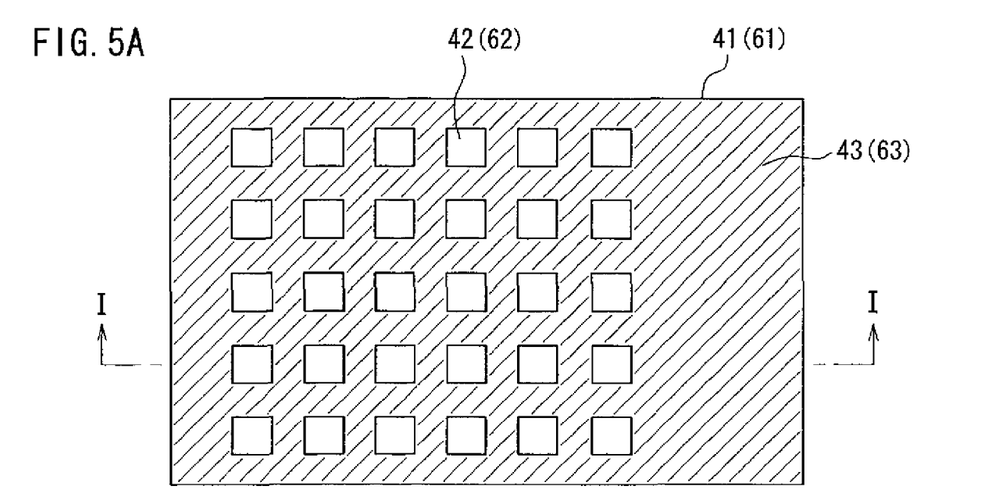
FIG. 5A is a plan view showing a cover material used in a bump formation method according to a fifth embodiment of the present invention.

FIG. 5A is a plan view of the cover material used in the bump formation method according to the fourth embodiment of the present invention. FIG. 5B is a cross-sectional view taken along line I-I of FIG. 5A.

First, in FIG. 5A, on the surface of a cover material 41 comprising, for example, ceramics or the like is formed a plurality of lands 42 made of, for example, Cu and Sn, and that are positioned to correspond to a plurality of connecting terminals of the circuit board (not shown in the drawings). Further, on the surface of the cover material 41 other than the lands 42 is applied a mold release agent 43 that is not adhesive towards heat-curing resin such as, for example, epoxy resin.

Figure 5B:
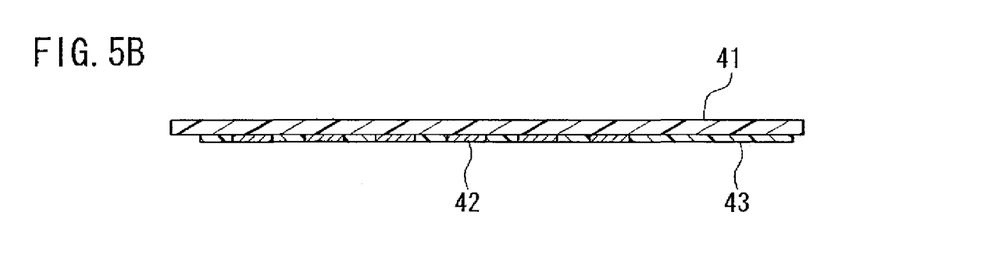
FIG. 5B is a cross-sectional view of FIG. 5A taken along the line I-I.
Figure 5C:
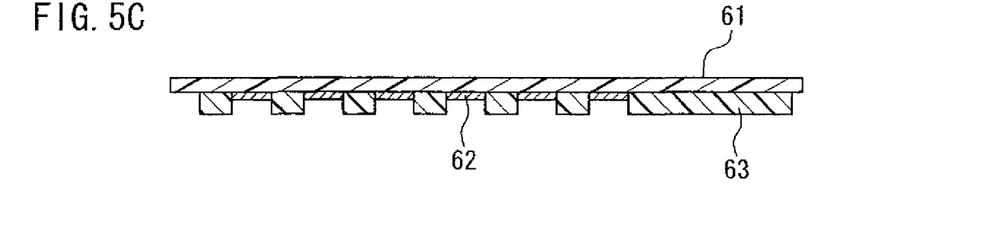
FIG. 5C is a cross-sectional view showing an application example of FIG. 5A taken along the line I-I.

In addition, FIG. 5C is a cross-sectional view taken along the I-I line of FIG. 5A, which shows a modified example of the cover material according to a fourth embodiment of the present invention. According to this modified example, the thickness of a mold release agent 63 that has been applied on a surface other than lands 62 is constituted by a cover material 61 that has been formed to be thicker than the lands 62.

Here, the cover material may be any material such as organic material or inorganic material, as long as the lands can be formed. Further, if the mold release agent is applied so as not to apply to the lands, metal material can be used.

Below, the bump formation method for forming bumps on the circuit board using a cover material according to the fifth embodiment of the present invention will be described with reference to FIG. 6 and FIG. 7.

First, FIGS. 6A-F will be used to describe the bump formation method using the cover material 41 of FIG. 5B.

Figure 6A:
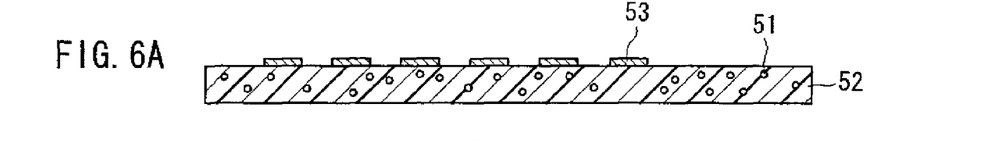
FIGS. 6A-F are step cross-sectional views showing a bump formation method according to a fourth embodiment of the present invention.

First, as shown in FIG. 6A, a circuit board 52, which is a first electronic component on which is formed a plurality of connecting terminals 53 and that comprises, for example, aramid epoxy resin, is prepared. And, the circuit board 52 includes a gas generation source 51 comprising moisture included due to attachment or absorption to the circuit board 52 or an evaporation-type gas generating agent such as, for example, butyl carbitol.

Figure 6B:
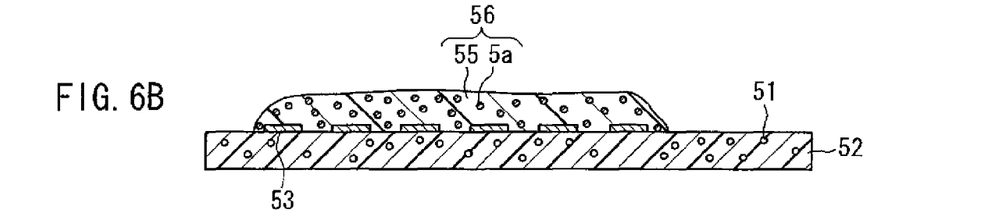

Next, as shown in FIG. 6B, to the surface of the circuit board 52 having the plurality of connecting terminals 53 is applied a solder resin composition 56 in which the solder powder 5a has been uniformly dispersed in a resin 55 including a heat-curing resin comprising, for example, glycol and maleic acid anhydride, and benzoyl peroxide, using, for example, a dispenser or the like.

Figure 6C:
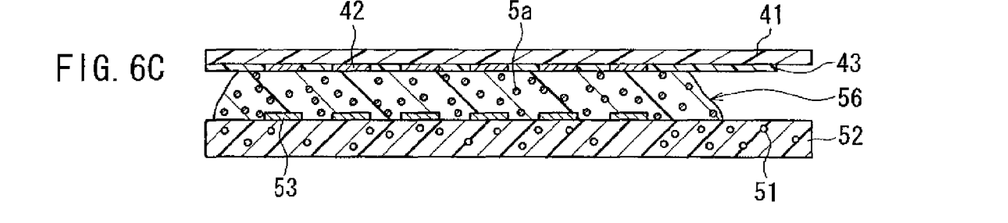

Then, as shown in FIG. 6C, the cover material 41 is mounted on the upper surface of the solder resin composition 56. At this time, contact is established with the connecting terminals 53 on the circuit board 52 and the lands 42 of the cover material 41 each respectively facing each other.

Figure 6D:
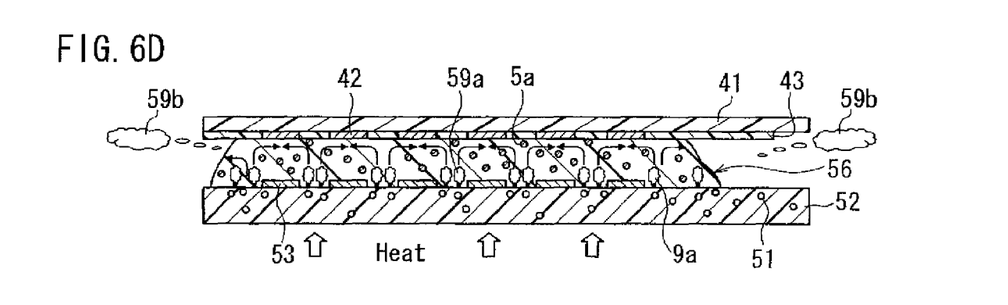

Next, as shown in FIG. 6D, the circuit board 52 and the solder resin composition 56 are heated from at least the circuit board 52 side using, for example, a heater. By doing so, butyl carbitol, which is the gas generation source 51 included in the circuit board 52, evaporates, and the vapor thereof becomes a gas 59a, which is ejected from the surface of the circuit board 52 to in the solder resin composition 56. At this time, most of the gas 59a is ejected from a surface other than the surface of the connecting terminals 53 of the circuit board 25.

Accompanying the increase in temperature is the decrease in the viscosity of the solder resin composition 56, and the ejected gas 59a causes convection of the solder resin composition 56. This convection results in the self-assembly of solder powder 5a on the connecting terminals 53 and the lands 42. At this time, the gas 59a is, after making the solder resin composition 56 flow, discharged externally, as a discharge gas 59b, through the peripheral space surrounded by the circuit board 52 and the cover material 41.

Figure 6E:
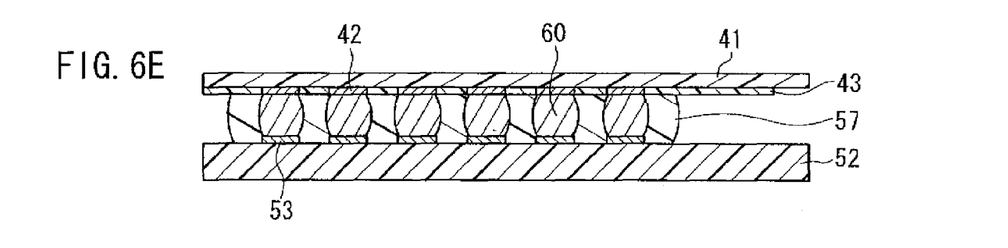

Next, as shown in FIG. 6E, the melted solder powder is self-assembled on the connecting terminals 53 and the lands 42, and grows while forming fusion solder as in the case shown in FIG. 2B. Subsequently, the fusion solder on the connecting terminals 53 and the fusion solder on the lands 42 of the cover material 41 are contacted.

Then, the cover material 41 is delaminated in the state in which the fusion solder is in a melted state and in which a resin layer 57 is formed by curing the resin 55 in the solder resin composition 56. Because a mold release agent 43 is applied to a surface excluding the lands 42 of the cover material 41, the cured resin layer 57 easily can be delaminated. In addition, because the fusion solder is still in a melted state, bumps 60 having protruding portions 60a that protrude from the surface of the resin layer 57 by the surface tension of the solder are formed.

Figure 6F:
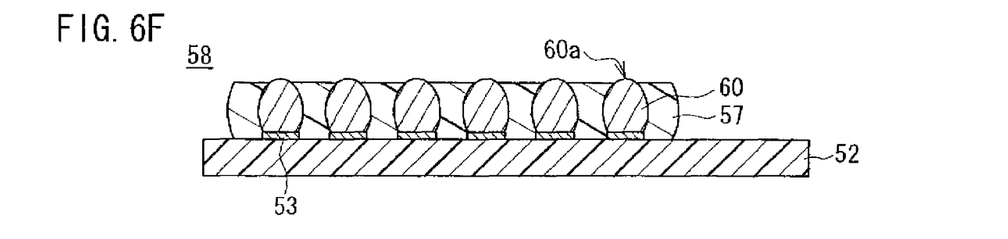

By the above steps, after delaminating the cover material 41 as shown in FIG. 6F, it is possible to manufacture the bump packaging body 58 in which has been formed the bumps 60 having the protruding portions 60a having a thickness thicker than that of the resin layer 57 by the fixing of the fusion solder, and that are uniform in height and spherical shaped.

According to the above fourth embodiment, it is possible to increase the efficiency of the self-assembly of solder powder by the lands set up in the cover material.

In addition, packaging with superior reliability of joining or the like becomes possible with respect to the bumps 60 formed by the above-described method, by using the resin layer 57 as a joining interval regulating material in a subsequent step, for example the flip chip packaging step of semiconductor chips.

Note that according to the fourth embodiment described above, if the cover material has mold release properties and can form metal lands, it is not necessary to apply the mold release agent and only the lands may be formed.

Below, a modified example of the bump formation method according to the fourth embodiment of the present invention is described using FIGS. 7A-B. FIGS. 7A-B are a bump formation method using the cover material 61 of FIG. 5C. Note that FIGS. 7A and B correspond respectively to FIGS. 6E and F, and other steps are the same as in FIG. 6.

Figure 7A:
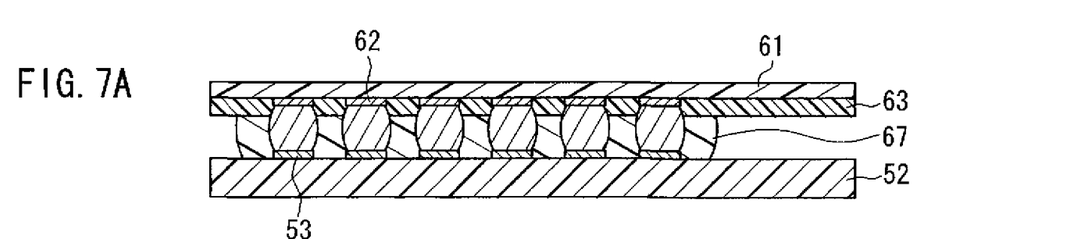
FIGS. 7A-B are step cross-sectional views showing an application example of the bump formation method according to the fourth embodiment of the present invention.

First, as shown in FIG. 7A and as in FIG. 6E, the fusion solder on the connecting terminals 53 and the fusion solder on the lands 62 of the cover material 61 are made to be contacted. At this time, the mold release agent 63 of the cover material 61 is thicker than the thickness of the lands 62, so the fusion solder is formed in a protruded state from a resin layer 67.

Figure 7B:
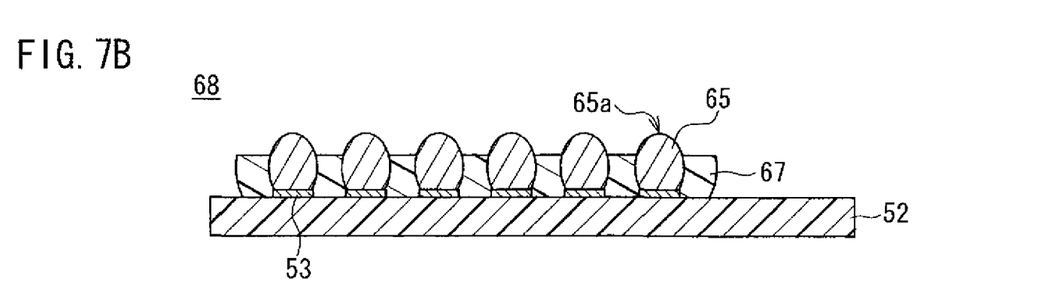

Next, as shown in FIG. 7B, after delaminating the cover material 61, by fixing of the fusion solder, it is possible to manufacture a bump packaging body 68 in which has been formed bumps 65 having protruding portions 65a having a thickness thicker than that of the resin layer 67 by the fixing of the fusion solder, and that are uniform in height and spherical shaped.

By doing so, the height of the bumps 65 can be set freely by the thickness of the mold release agent 63. Further, because the protruding portions 65a of the bumps 65 can be formed to be higher than the surface of the resin layer 67, a flip chip packaging body superior in connection reliability with semiconductor chips or the like performed at a different step can be manufactured.

In addition, according to each embodiment of the present invention, it is acceptable as long as the solder powder in the solder resin composition finally is formed through a melted state when the solder layer or bumps are formed. That is, it is acceptable if solder powder is melted at any of before convection of the solder resin composition by a gas, during convection, or after self-assembly, and if the solder layer and bumps are formed in that state, and there are no particular limitations.

Also, for each of the embodiments of the present invention there was described an example of applying a solder resin composition on a circuit board by printing in paste form, but the resin in the solder resin composition can be half-hardened beforehand and sandwiched between the circuit board and the cover material in a sheet shape of prepreg state.

In addition, a solder resin composition that, after bumps have been formed on the connecting terminals, can be removed easily from the top of the circuit board by washing or the like does not harden when heated, and has a resin with flowability even when cooled further is preferred.

Also, the solder powder used according to each of the embodiments of the present invention may use, but is not limited to, conventional solder such as a Pb—Sn alloy. For example, it is further preferred, from an environmental perspective, to use Pb-free solder such as Sn—Ag, Sn—Ag—Cu, Sn—Bi—Ag—In, Sn—Bi—Zn, or Sn—Bi—Ag—Cu, which have been developed and used as a result of recent environmental issues.

In addition, in each of the embodiments of the present invention, examples were described in which epoxy resin, as a resin of a solder resin composition, and unsaturated polyester resin were used. However, other than these, it is possible to use a resin that has as its main component any one of polybutadiene resin, polyimide resin, polyamide resin, and cyanate resin.

In addition, as the gas generation source according to each embodiment of the present invention, examples were described in which butyl carbitol as moisture and evaporation-type gas generating agent, or aluminum hydroxide as decomposition-type gas generating agent are used, but the gas generation source is not limited to these only. For example, as an evaporation-type gas generating agent, hexane, vinyl acetate, isopropyl alcohol, butyl acetate, propionic acid, ethylene glycol, N-methyl-2-pyrrolidone, α-terpineol, butyl carbitol, and butyl carbitol acetate may be used, and as a decomposition-type gas generating agent that decomposes when heated and generates gases such as $H_2O$, $CO_2$, and $N_2$, at least one of dawsonite, ammonium metaborate, barium metaborate, azodicarboxylic amide (ADCA), sodium acid carbonate, aluminum hydroxide, calcium aluminate, boric acid, N,N'-dinitrosopentamethylene tetramine (DPT), and 4,4'-oxybis (benzenesulfonyl hydrazide) (OBSH) may be used. Further, among the above-described gas generating agents, an agent that has a boiling point or a decomposition temperature between the cure reaction start temperature and cure temperature of the solder resin composition, and that causes the gas to be ejected from the circuit board at the boiling point or the decomposition temperature is more preferable.

In addition, the circuit board including the gas generation source and that is used in each of the embodiments of the present invention, may be manufactured according to the method described below.

For example, in the case where the circuit board is an aramid epoxy resin substrate, it is possible to make the circuit board by preparing powder particles such as sodium acid carbonate or aluminum hydroxide at a constant particle size, mixing the powder particles as a filler in an amount to provide a necessary ejection gas level with an epoxy resin material for impregnation of an aramid nonwoven fabric, and then impregnating the aramid nonwoven fabric with the mixture, followed by pressurizing and heat-curing.

In addition, by applying an epoxy resin including a gas generation source such as aluminum hydroxide to a surface part on which is formed a line after impregnating the aramid nonwoven fabric with normal epoxy resin, it is possible to make a circuit board that differs in content density of the gas generation source in the direction of thickness. By doing so, the gas generation source is formed in a concentrated manner at the surface part of the circuit board, so sufficient gas ejection can be obtained with a short duration of heat treatment, and this has a large effect towards promoting the convection of solder powder.

Industrial Applicability

The flip chip packaging method and bump formation method of the present invention can efficiently make solder powder in a solder resin composition self-assemble and grow on connecting terminals or the like by gas ejected from a gas generation source included in a circuit board, and hence is useful in the packaging field of circuit boards, semiconductor chips, and so on.

The invention claimed is:

1. A flip chip packaging method for connecting a first electronic component including a plurality of connecting terminals and a second electronic component including a plurality of electrode terminals corresponding to the connecting terminals, comprising the steps of:
    mounting a solder resin composition including a solder powder and a resin on the first electronic component;
    arranging the connecting terminals of the first electronic component and the electrode terminals of the second electronic component to face each other;
    wherein the first electronic component is in a state to eject a gas when heated;
    ejecting a gas from a gas generation source included in the first electronic component by heating the first electronic component and the solder resin composition; and
    inducing the flow of the solder powder in the solder resin composition by inducing convection of the gas in the solder resin composition, and electrically connecting the connecting terminals and the electrode terminals by self-assembly on the connecting terminals and the electrode terminals.

2. The flip chip packaging method according to claim 1, wherein after electrically connecting the connecting terminals and the electrode terminals, the first electronic component and the second electronic component are bonded by curing the resin.

3. The flip chip packaging method according to claim 1, wherein the gas generation source is moisture included in the first electronic component.

4. The flip chip packaging method according to claim 1, wherein the gas generation source is a gas generating agent included in the first electronic component.

5. The flip chip packaging method according to claim 4, wherein the gas generating agent is an evaporation-type gas generating agent selected from at least one of hexane, vinyl acetate, isopropyl alcohol, butyl acetate, propionic acid, ethylene glycol, N-methyl-2-pyrrolidone, α-terpineol, butyl carbitol, and butyl carbitol acetate.

6. The flip chip packaging method according to claim 4, wherein the gas generating agent is a decomposition-type gas generating agent selected from at least one of aluminum hydroxide, dawsonite, ammonium metaborate, barium metaborate, azodicarboxylic amide (ADCA), sodium acid carbonate, aluminum hydroxide, calcium aluminate, boric acid, N,N'-dinitrosopentamethylene tetramine (DPT), and 4,4'-oxybis(benzenesulfonyl hydrazide) (OBSH).

7. The flip chip packaging method according to claims 1, wherein the first electronic component is a circuit board and the second electronic component is a semiconductor chip.

8. The flip chip packaging method according to claim 1, wherein the gas generating agent has a boiling point or a decomposition temperature between the cure reaction start temperature and cure temperature of the solder resin composition, and the gas is ejected from the circuit board at the boiling point or the decomposition temperature.

9. The flip chip packaging method according to claim 1, wherein the solder resin composition resin is a heat-curing resin that has as its main component one of epoxy resin, unsaturated polyester resin, alkyd resin, polybutadiene resin, polyimide resin, polyamide resin, and cyanate resin.

* * * * *